United States Patent
Root et al.

(10) Patent No.: US 8,170,854 B2
(45) Date of Patent: May 1, 2012

(54) BEHAVIORAL MODEL GENERATION

(75) Inventors: David E. Root, Santa Rosa, CA (US); David D. Sharrit, Phoenix, AZ (US); John Wood, Tempe, AZ (US)

(73) Assignee: Agilent Technologies, Inc., Santa Clara, CA (US)

( * ) Notice: Subject to any disclaimer, the term of this patent is extended or adjusted under 35 U.S.C. 154(b) by 1425 days.

(21) Appl. No.: 11/035,651

(22) Filed: Jan. 14, 2005

(65) Prior Publication Data
US 2006/0161409 A1    Jul. 20, 2006

(51) Int. Cl.
G06F 17/50    (2006.01)
G06G 7/62    (2006.01)
(52) U.S. Cl. .......................................... 703/13
(58) Field of Classification Search .................. 324/638; 703/14, 13
See application file for complete search history.

(56) References Cited

U.S. PATENT DOCUMENTS

| | | | | |
|---|---|---|---|---|
| 5,808,915 | A * | 9/1998 | Troyanovsky | 703/14 |
| 2002/0196033 | A1* | 12/2002 | Martens | 324/612 |
| 2004/0257092 | A1* | 12/2004 | Verspecht | 324/638 |

OTHER PUBLICATIONS

Verspecht, Jan. Bossche, Marc, and Verbeyst, Frans. Characterizing Components Under Large Signal Excitation: Defining Sensible "Large Signal S-Parameters" Spring 1997, 49th ARFTG Conference Digest. pp. 1-9.*

E. Ngoya et al., "Accurate RF and Microwave System Level Modeling of Wide Band Nonlinear Circuits", 2000 IEEE MTT-S Digest, pp. 79-82.

"Harmonic Balance Simulation", Agilent Technologies; Dec. 2003, pp. 5-1 through 5-18 available from Agilent Technologies, Inc., www.agilent.com.

* cited by examiner

*Primary Examiner* — Kakali Chaki
*Assistant Examiner* — Ben Rifkin

(57) ABSTRACT

A model of a device is generated. An input port of the device is stimulated with a large amplitude signal having a central frequency. A first port of the device is perturbed with a small amplitude signal tone. The small amplitude signal tone is at a frequency offset slightly from a harmonic of the central frequency. Spectral component frequencies of a resulting signal from the device are obtained to determine model coefficients for the device. At least some of the spectral component frequencies occur at frequencies offset slightly from harmonics of the central frequency.

19 Claims, 2 Drawing Sheets

BEHAVIORAL MODEL GENERATION

BACKGROUND

The design of broadband microwave systems and modules for modern instrumentation applications presents a significant challenge. A typical microwave system will contain several active integrated circuit (IC) components as well as passive elements, both of which may be distributed in nature. Such a system is often too complex to permit complete simulation of the non-linear behavior at the transistor level of description. A complete system simulation can become practical, however, provided the design is done at a higher level of abstraction, using behavioral models of the nonlinear blocks or ICs. The behavioral models must describe the frequency dependent nonlinear behavior of the ICs and must describe properly the propagation of harmonic and intermodulation distortions through the system, to enable the designer to meet rigid specifications, while being simple enough to allow rapid simulation.

It is desirable, therefore, to generate an extended nonlinear frequency domain behavioral model from automated large-signal vector network measurements and from automated simulations and analysis of detailed circuit-level models. Such a 'black-box' behavioral model should require no a priori knowledge of the device physics or circuit configuration of the nonlinear component.

SUMMARY OF THE INVENTION

In accordance with an embodiment of the present invention, a model of a device is generated. An input port of the device is stimulated with a large amplitude signal having a central frequency. A first port of the device is perturbed with a small amplitude signal tone. The small amplitude signal tone is at a frequency offset slightly from a harmonic of the central frequency. Spectral component frequencies of a resulting signal from the device are obtained to determine model coefficients for the device. At least some of the spectral component frequencies occur at frequencies offset slightly from harmonics of the central frequency.

DESCRIPTION OF THE EMBODIMENT

Figure 1:
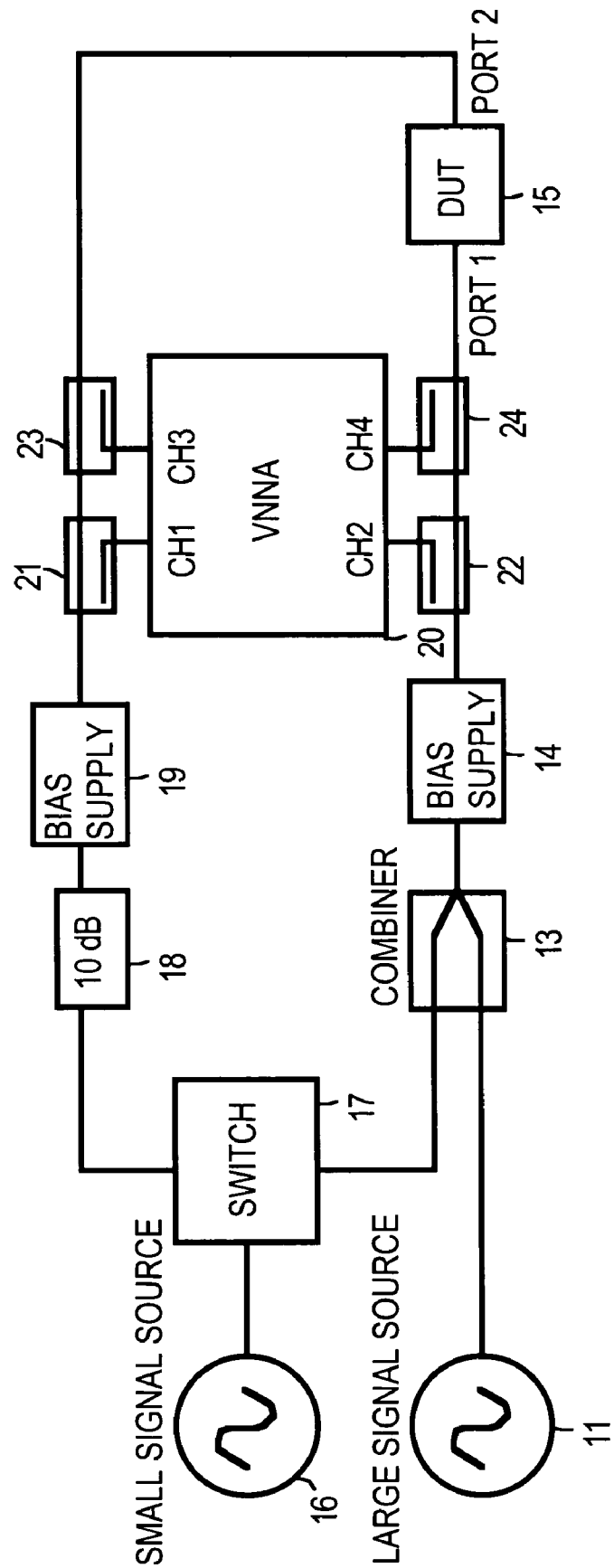
FIG. 1 shows a simplified block diagram of a test configuration for testing a device under test (DUT) in order to extract the information necessary to generate an extended nonlinear frequency domain behavioral model in accordance with another embodiment of the present invention.

FIG. 1 shows a simplified block diagram of a test configuration for testing a device under test (DUT) 15 in order to extract the information necessary to generate an extended nonlinear frequency domain behavioral model. A large amplitude signal source 11 provides a large amplitude signal tone through a combiner 13 and a bias supply 14 to port 1 of DUT 15. For example combiner 13 is a broadband Wilkinson combiner. A small amplitude signal source 16 provides a small amplitude signal tone through a switch 17 to port 1 of DUT 15, and/or through switch 17 through 10 dB amplifier 18, through bias supply 19 to port 2 of DUT 15. The small amplitude signal tone has a small amplitude with respect to the large amplitude signal tone. A vector nonlinear network analyzer (VNNA) 20 performs automated large-signal vector network measurements using a coupler 21 for channel 1 measurements, a coupler 22 for channel 2 measurements, a coupler 23 for channel 3 measurements and a coupler 24 for channel 4 measurements. For example, VNNA 20 is a 50 GHz vector nonlinear network analyzer. Measurements can be performed, for example, using the narrow-band modulation mode of VNNA 20.

For example, while large amplitude signal source 11 provides a constant large amplitude signal tone to port 1 of DUT 15, small amplitude signal source 16 varies the frequency of the small amplitude signal tone when applying the small amplitude signal tone to each port. For example, at each port the small amplitude signal tone is separately presented at each harmonic of the large amplitude signal tone. For example, this is done for each harmonic of the large amplitude signal tone up to the maximum number needed for the desired model or the limitation of the bandwidth of small amplitude signal source 16 and/or VNNA 20.

VNNA 20 performs measurements in order to generate parameters used to describe DUT 15 behavior under large signal operating conditions. These parameters may be represented, for example by "S" and "T" coefficients.

For example, the S and T coefficients are used to model operation of DUT 15 in accordance with Equation 1 below:

$$B_{pk}(|A_{11}|, f) = \sum_q \sum_{l=1,...,M} S_{pq,kl}(|A_{11}|, f) \cdot P^{k-l} \cdot A_{ql} + \sum_q \sum_{l=1,...,M} T_{pq,kl}(|A_{11}|, f) \cdot P^{k+l} \cdot A_{ql}^*$$

Equation 1

Equation 1 sets out a Poly-Harmonic Distortion (PHD) behavioral model defined by equations in the frequency domain relating complex transmitted and scattered waves, at each port, p, and harmonic index, k, to a linear combination of terms in the incident waves at each port at each harmonic, and, independently, the complex conjugates of the incident waves and their harmonics. The fact that the complex conjugate terms in the incident waves appear is a necessary consequence of the non-analyticity of the Jacobian of the spectral mapping of the input large amplitude signal tone to the output harmonic spectrum, which represents the linearization around the time-varying operating point established by the single large-amplitude signal tone in the absence of perturbation by the small amplitude signal tone. The sums are over all port indices q, and harmonic indices, l. The term $|A_{11}|$ represents the amplitude of the large amplitude signal tone. The term f represents the fundamental frequency of the large amplitude signal tone. The term $B_{pk}$ represents the output of DUT 15 at port p and at harmonic k. The term $A_{ql}$ represents the input of DUT 15 at port q and at harmonic l. The term $A^*_{ql}$ represents a complex component of the input of DUT 15 at port q and at harmonic l.

In Equation 1, direct current (DC) is excluded, so the sum over l starts at the fundamental. Equation 1 can be extended to include the DC term, in which case the sum starts from index 0.

In Equation 1, "P" is a pure phase that along with the magnitude-only dependence on the S and T coefficients, is a necessary consequence of the assumed time-invariance of the underlying system and the single, large, input tone excitation.

For example, "P" can further be expressed as in Equation 2 below:

$$P = \exp(jArg(A_{11}))$$ Equation 2

A redundancy, introduced by summing over the fundamental components (l=1) in addition to the harmonics in Equation 1, requires the imposition of the additional constraints given by Equation 3 below:

$$T_{p1,k1} = 0$$ Equation 3

In Equation 1, the coefficients S and T are shown dependent on $|A_{11}|$ and f. When, for simplicity, this dependency is dropped, and phase multiplication is used to provide normalized quantities, Equation 1 can be re-expressed as set out in Equation 4 below:

$$b_{pk} = \sum_q \sum_{l=1\ldots,M} S_{pq,kl} \cdot a_{ql} + \sum_q \sum_{l=1\ldots,M} T_{pq,kl} a_{ql}^*$$ Equation 4

The structure of the model set out by Equations 1, 2 and 3 is such that, in principle, the S and T coefficients for each port at each harmonic can be extracted directly from three measurements. These measurements are the responses at each port and at each harmonic frequency to the large amplitude signal tone without perturbation by the small amplitude signal tone; and the responses with the large amplitude signal tone perturbed by the small-signal tone applied with two different relative phases with respect to the fundamental frequency of the large amplitude signal tone.

For example, for each power level of the large amplitude signal tone, the small amplitude signal tone is applied separately at each harmonic at each port. If the measurement system cannot control the phase of the small amplitude signal tones relative to the fundamental large amplitude signal tone, the measurements are made with several randomized phases, and the S and T coefficients may be extracted by regression analysis.

Extracting the S and T coefficients for each port at each harmonic using measurements based on different relative phases can require many measurements. Taking measurements at several different phases relative to the large amplitude signal tone can multiply the number of needed measurements by a factor of from 2 to 10, typically. Moreover, generating S and T coefficients in this way may limit the dynamic range and therefore the numerical precision to which the model can be identified. The measured and simulated data produced contains, mixed in and in addition to the desired data, spurious nonlinear response data. Not only does this increase the size of a file containing the data, it precludes a direct solution for the nonlinear model. It requires instead a more complicated regression analysis to identify the model from this non-ideal response data than is otherwise required. The multi-tone harmonic balance simulations used to generate the virtual excitations of the detailed model for use in the regression analysis can result in a dramatically longer simulation time and memory usage than desirable.

Alternatively, the S and T coefficients for each port at each harmonic can be extracted using a single stimulation, provided the small amplitude signal tones, instead of being generated right on each harmonic of the large amplitude signal tone, are instead generated at a frequency slightly offset from the harmonic of the large amplitude signal tone. This is described more fully below.

For a single port of DUT 15, the output wave, as a function of time, b(t), is also a nonlinear function of the input wave b(a(t)) as set out in Equation 5 below:

$$b(t) = b(a(t))$$ Equation 5

In Equation 5, the output signals are considered to be real signals and the nonlinearity is algebraic. This restriction is not necessary but facilitates a simpler way to the result.

Now consider a perturbation signal (i.e., the small amplitude signal tone) added to a(t). The response is given in Equation 6 below:

$$b(t) = b(a(t)) + \Delta a(t))$$ Equation 6

Assuming the perturbation is small, Equation 6 can be expanded in a Taylor series, with terms kept only up through first order, as set out in Equation 7 below:

$$b(t) \approx b_0(t) + \Delta b(t) = b(a(t)) + \frac{\partial b(a(t))}{\partial a} \cdot \Delta a(t)$$ Equation 7

In Equation 7, $b_0(t) = b(a(t))$.

The linear response is given by Equation 8 below:

$$\Delta b(t) = \frac{\partial b(a(t))}{\partial a} \cdot \Delta a(t)$$ Equation 8

Provided b(t) and a(t) are periodic, a Fourier series can be used to expand the ratio set out in Equation 8. The fundamental frequency of a(t) is $f_0 = \omega_0/2\pi$. The perturbation signal (i.e., the small amplitude signal tone) $\Delta a(t)$ can also assumed to be a real periodic signal with a period equal to $2\pi/\Omega$. The result is shown in Equations 9 below:

$$\frac{\partial b(a(t))}{\partial a} = \Lambda_{DC} + \sum_{n=1}^{\infty}(\Lambda_n e^{jn\omega_0 t} \Lambda_n^* e^{-jn\omega_0 t})$$ Equation 9

$$\Delta a(t) = \partial e^{j\omega t} + \partial^* e^{-j\omega t}$$

In Equation 9, $\partial$ is a complex number that has a small magnitude. Unlike the PHD model operation of DUT 15 described in Equation 1, Equation 9 sets out that there are two periodic signals, one large, one small, with unrelated fundamental periods. This is a more general system. Substituting values of Equation 9 into Equation 8 and performing the multiplication yields Equation 10 below:

$$\Delta b(t) = \Lambda_{DC}\partial e^{j\Omega t} + \Lambda_{DC}\partial^* e^{-j\Omega t} + \sum_{n=1}^{\infty}\begin{pmatrix}\Lambda_n \partial e^{j(\Omega+n\omega_0)t} + \Lambda_n^* \partial e^{-j(\Omega+n\omega_0)t} + \\ \Lambda_n \partial^* e^{j(n\omega_0 - \Omega)t} + \Lambda_n^* \partial^* e^{-j(n\omega_0 + \Omega)t}\end{pmatrix}$$ Equation 10

When the frequency of the small amplitude signal tone is very nearly a harmonic (integer multiple) of the fundamental frequency of the large amplitude signal tone, $\Omega = m\omega_0 + \epsilon$ where $\epsilon$ is a positive infinitesimal. Because of the frequency offset, $\Omega$ is referred to the upper sideband stimulus at frequency $m\omega_0$.

In order to pick out the complex spectral components of the response, $\Delta b(t)$, in the frequency domain, at the harmonic frequencies $l\omega_0$ for non-negative integers l(l=1, 2, 3 . . . ), the contributions are broken up into terms proportional to $\partial$ and ∂* separately. For simplicity, it is assumed there are no DC components. For the third and fourth terms on right hand side of Equation 10, the contributions that are proportional to ∂ are $A_{l-m}$, for $l-m \geq 1$, or $A_{m-l}$, for $l-m \leq -1$. For the fifth and sixth terms on right hand side of Equation 10, the contributions that are proportional to ∂* are $A_{l+m}$, for $l+m \geq 1$, or $A_{-(m+l)}$, for $l+m \leq -1$. Thus the linearized response, $\Delta b_{lm}$, at the $l^{th}$ harmonic, in response to the perturbation at the $m^{th}$ harmonic is interpreted to be as set out in Equation 11 below:

$$\Delta b_{lm} = S_{lm}\partial + T_{lm}\partial^* \quad \text{Equation 11}$$

In Equation 11, the coefficients "S" are given in terms of the harmonic series for the conductance as described above. This allows the behavior of the S and T coefficient functions to be related to the Volterra representation of the original nonlinearity.

When Equation 11 is compared to Equation 4, it can be seen that the coefficients of the PHD model can be explicitly calculated in terms of the Fourier series of the "conductance" nonlinearity of Equation 9. Keeping track of the ε term it can be seen that the S coefficients are the responses at the upper sideband and the T coefficients, at the same index, are the lower sideband responses.

More generally, from basic mixer theory, if a signal consisting of the sum of two tones, at (angular) frequencies $\omega_0$ and $\omega_1$ respectively, are put through a nonlinear device, the discrete frequencies of the response fall at frequencies $\omega_{mix}$ satisfying Equation 12 below:

$$\omega_{mix} = N\omega_0 + M\omega_t \quad \text{Equations 12}$$

In equation 12, N and M are integers related to the order of the mixing terms and $\omega_{mix} \geq 0$ (to keep from double counting).

In an embodiment of the present invention, it is assume that the amplitude of the small amplitude signal tone is always small compared to the amplitude of the large amplitude signal tone. This is equivalent to restricting $M = \pm 1$.

The small amplitude signal tone frequency $\omega_1$ is set to $\omega_1 = m\omega_0 + \epsilon$. For $\epsilon = 0$ is obtained the degenerate case of the harmonically related experiment of the classic approach. This corresponds to a small tone at the $m^{th}$ harmonic of the fundamental frequency of the large amplitude signal tone. Considering ε as a positive infinitesimal allows the two different terms that contribute to the same frequencies in the output spectrum due to different origins to be tracked.

By way of illustration, consider an example for which the large amplitude signal tone frequency $\omega_0 = 3$ GHz. If $m=2$, then the small amplitude signal tone frequency $\omega_1 = 6$ GHz+ε. Measurements for the spectral response can be made as set out in Table 1 below:

TABLE 1

| Spectral Component Frequency (GHz) | N | M | Sideband | Model Coefficient |
|---|---|---|---|---|
| 0 + ε | −2 | 1 | Upper | $S_{i0,jm}$ |
| 3 − ε | 3 | −1 | Lower | $T_{i1,jm}$ |
| 3 + ε | −1 | 1 | Upper | $S_{i1,jm}$ |
| 6 − ε | 4 | −1 | Lower | $T_{i2,jm}$ |
| 6 + ε | 0 | 1 | Upper | $S_{i2,jm}$ |
| 9 − ε | 5 | −1 | Lower | $T_{i3,jm}$ |
| 9 + ε | 1 | 1 | Upper | $S_{i3,jm}$ |
| 12 − ε | 6 | −1 | Lower | $T_{i4,jm}$ |
| 12 + ε | 2 | 1 | Upper | $S_{i4,jm}$ |
| 15 − ε | 7 | −1 | Lower | $T_{i5,jm}$ |
| 15 + ε | 3 | 1 | Upper | $S_{i5,jm}$ |
| 18 − ε | 8 | −1 | Lower | $T_{i6,jm}$ |
| 18 + ε | 4 | 1 | Upper | $S_{i6,jm}$ |

In Table 1, the first column indicates a frequency of the spectral component of the linearized output that is proportional to the amplitude of the small amplitude signal tone. The second column is the order (N) of the large tone contributing to the frequency component specified in that row. A negative sign indicates the negative frequency component. The third column indicates the order (M) of the small tone. As discussed above, only terms for $M = \pm 1$ are considered. The fourth column indicates whether the contribution to this frequency is at the lower or upper sideband. This is determined by the whether ε has been added or subtracted to obtain the frequency of the spectral component. This also can be determined based on whether M is positive or negative. The fifth column indicates for each row the model coefficient that can be determined by a measurement taken at the spectral column frequency.

As can be seen from Table 1, there is only one contribution at frequency=0. This is an upper sideband. There are two contributions to the next group of frequencies, from 3 GHz through 18 GHz, in the same order of first lower and then upper sidebands. This follows from the two different contributions of orders of the large and small tones that can combine to give terms at each of these frequencies. For example, at 9 GHz, the $5^{th}$ order contribution from the large amplitude signal tone at the frequency of 3 GHz combines with the negative frequency component of the small amplitude signal tone at the frequency of 6 GHz to give a component at 5*3 GHz+2*3 GHz*(−1)=9 GHz. The upper sideband comes from a combination of a first order term in tone one with the positive term from tone 2, because 1*3 GHz+1*2*3 GHz=9 GHz. There are no other combinations possible to end up at 9 GHz.

Depending upon the accuracy required, additional measurements can be taken at higher harmonics of the large amplitude signal tone frequency. When taking measurements from DUT 15, upper and lower sidebands can be detected at each harmonic frequency for the large amplitude signal tone provided the magnitude of the sideband tones is large enough to measure and provided the offset, ε, in the small amplitude signal tone frequency is not too small to separately resolve the two sidebands.

For sufficiently high order, the pattern of alternating sidebands will persist. The S and T coefficients are extracted according to the following Equations 13 in terms of normalized quantities:

$$S_{lm} = \frac{\Delta b_{ml}^+}{\partial} \quad \text{Equations 13}$$

$$T_{lm} = \frac{\Delta b_{ml}^-}{\partial^*}$$

In Equations 13 the "+" and "−" symbols indicate the upper and lower sidebands, respectively, for each harmonic l of the larger amplitude signal tone in response to a perturbation by the smaller amplitude signal tone at the harmonic m of the fundamental frequency of the larger amplitude signal tone.

In the first column of Table 1, a subset of all the frequencies at which there is a response of nonlinear DUT 15 to the combined large amplitude signal tone and small amplitude signal tone at the $m^{th}$ harmonic (in this example m=2). The subset corresponds to those frequencies at which the response is proportional to the amplitude of the small amplitude signal tone. This represents the difference between the full output spectrum of the system with one large amplitude signal tone and one small amplitude signal tone, and the output of the system with only the single large amplitude signal tone with no small amplitude signal tone added. A table such as Table 1 exists for each value of m for which measurements are made. When making measurements of DUT 15, $\epsilon$ is not zero, but very small compared with the frequency of the large amplitude signal tone.

Figure 2:
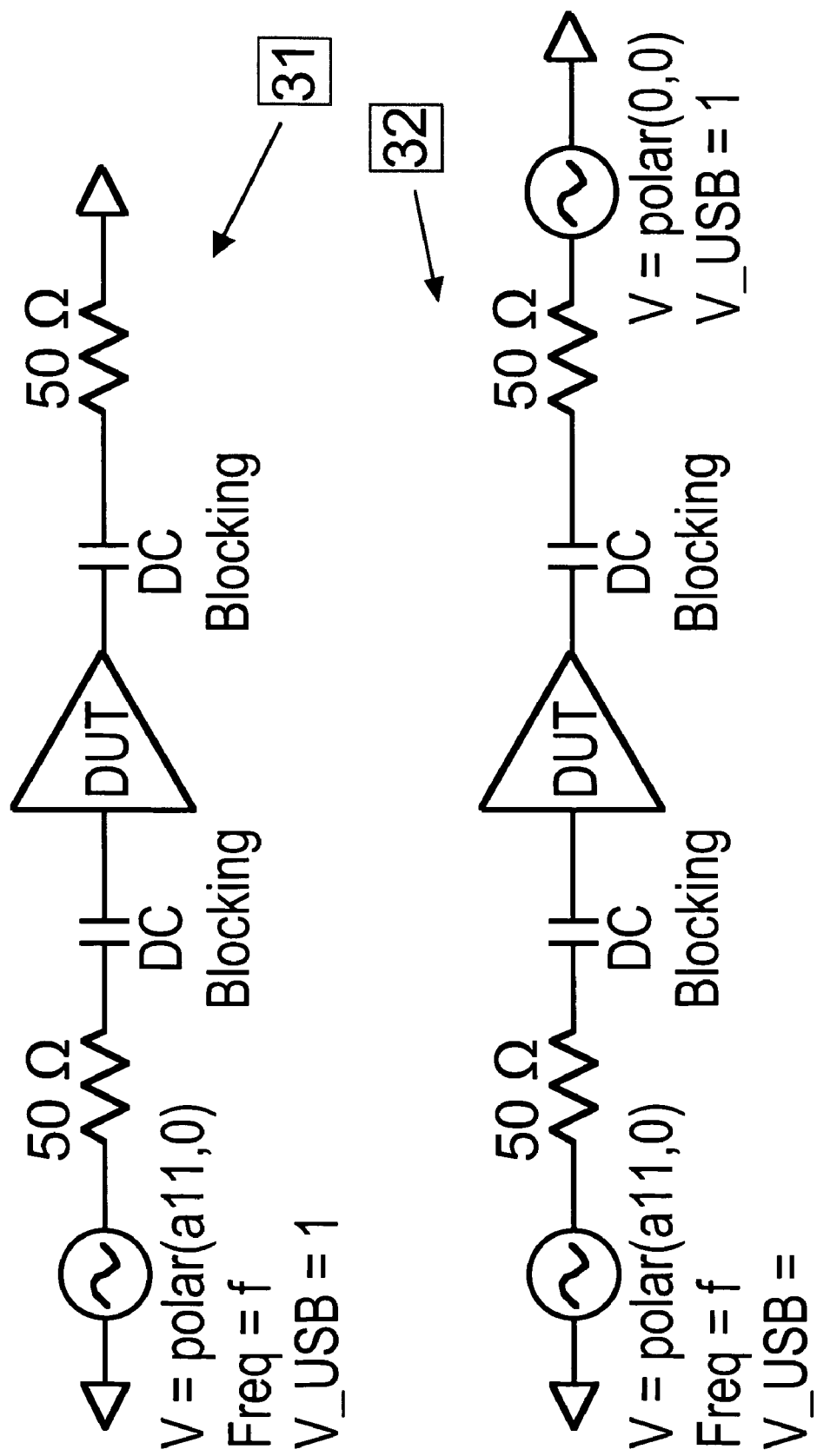
FIG. 2 shows test configuration for a simulation used to extract the information necessary to generate an extended nonlinear frequency domain behavioral model in accordance with another embodiment of the present invention.

The same mixer analysis can be used during device simulation. FIG. 2 illustrates a simulator set up to test a device under test (DUT). In a first set up portion 31, the DUT is isolated by DC blocking capacitors and 50 Ohm resistors. An input port signal source provides a signal to the DUT. "V=polar($a_{11}$,0)" specifies a large amplitude signal tone has amplitude $a_{11}$. "Freq=f" specifies the fundamental frequency of the large amplitude signal tone. "V_USB=1" indicates a small amplitude signal tone is placed at this port.

In a second set up portion 32, the DUT is also isolated by DC blocking capacitors and 50 Ohm resistors. An input port signal source provides a signal to the DUT. "V=polar($a_{11}$,0)" specifies a large amplitude signal tone has amplitude $a_{11}$. "Freq=f" specifies the fundamental frequency of the large amplitude signal tone. "V_USB=" indicates no small amplitude signal tone is placed at this port. An output port signal source also provides a signal to the DUT. "V=polar(0,0)" indicates no large amplitude signal tone is placed at the output port. "V_USB=1" indicates a small amplitude signal tone is placed at this port.

For the case where small signal mixer (SM) analysis is utilized (ss_freq=Yes) and the order of the harmonic balance calculation is set equal to 8, Table 2 below sets out pseudo code illustrating performance of an example simulation:

TABLE 2

Sweep $a_{11}$ from 0.01 Volts(V) to 1 V
   Step f from 3 GHz to 7GHz, step = 1 GHz
      Perform a harmonic Balance Simulation at $a_{11}$ and f
      Step SASTF from f+$\epsilon$ to 5f+$\epsilon$ , step = f
         Evaluate small-signal mixer output at $a_{11}$, f and SSATF
      End Loop
   End Loop
End In Table 2, SASTF represents the small amplitude signal tone frequency. Table 3 below sets out a spectral response for an evaluation of the small-signal mixer output at $a_{11}$, when f=3 GHz and SASTF=6 GHz+$\epsilon$. In Table 3, the spectral response is listed in order of increasing frequencies.

TABLE 3

| Spectral Component Frequency (GHz) | N | M | Sideband | Model Coefficient |
| --- | --- | --- | --- | --- |
| 0 + $\epsilon$ | -2 | 1 | Upper | $S_{i0,jm}$ |
| 3 - $\epsilon$ | 3 | -1 | Lower | $T_{i1,jm}$ |
| 3 + $\epsilon$ | -1 | 1 | Upper | $S_{i1,jm}$ |
| 6 - $\epsilon$ | 4 | -1 | Lower | $T_{i2,jm}$ |
| 6 + $\epsilon$ | 0 | 1 | Upper | $S_{i2,jm}$ |
| 9 - $\epsilon$ | 5 | -1 | Lower | $T_{i3,jm}$ |
| 9 + $\epsilon$ | 1 | 1 | Upper | $S_{i3,jm}$ |
| 12 - $\epsilon$ | 6 | -1 | Lower | $T_{i4,jm}$ |
| 12 + $\epsilon$ | 2 | 1 | Upper | $S_{i4,jm}$ |
| 15 - $\epsilon$ | 7 | -1 | Lower | $T_{i5,jm}$ |
| 15 + $\epsilon$ | 3 | 1 | Upper | $S_{i5,jm}$ |
| 18 - $\epsilon$ | 8 | -1 | Lower | $T_{i6,jm}$ |
| 18 + $\epsilon$ | 4 | 1 | Upper | $S_{i6,jm}$ |
| 21 + $\epsilon$ | 5 | 1 | Upper | |
| 24 + $\epsilon$ | 6 | 1 | Upper | |
| 27 + $\epsilon$ | 7 | 1 | Upper | |
| 30 + $\epsilon$ | 8 | 1 | Upper | |

As can be seen from Table 3, at 21 GHz, 24 GHz, 27 GHz and 30 GHz there are only upper sidebands. This is because for a lower sideband to exist, it must correspond to the solution of the following Equation 14, for example, for the case of 21 GHz.

$$21 \text{ GHz}=n\cdot 3 \text{ GHz}-2\cdot 3 \text{ GHz} \qquad \text{Equation 14}$$

In equation 14, n=9, which is beyond the order of the harmonic balance calculation (set equal to 8), so the lower sideband is not calculated in the simulation. If additional lower sidebands are desired, the order of the harmonic balance calculation can be increased.

When performing a simulation using the Advance Design System analysis can be used as the excitation. One advantage of this approach is that the simulation is much faster, since the only harmonic balance analysis done is for the single large amplitude signal tone, rather than a two-tone analysis. Another advantage is that the SM analysis results in exactly (to numerical precision) the linearized response of the system under a large amplitude signal drive to the perturbations at the harmonics. A two-tone harmonic balance analysis, even for one of the tones being small, would produce many additional mixing terms which increases the size of dataset and requires a more complicated regression analysis to identify the model.

The simulation is set up by stepping the small-signal offset frequency from zero plus $\epsilon$ to some upper multiple of the fundamental large tone plus $\epsilon$, at each port separately. For each of these conditions, an SM analysis is performed for each power level and fundamental frequency over which the model is to be used. The result of the analysis is precisely (for each fundamental) the set of data shown in Table 3. The results for any values of $\epsilon$ in this range are usually identical to five significant digits.

For example, when the simulation is performed using the ADS software, simulated data is exported to a Common Instrumentation Transfer and Interchange file (Citifile) format. A Mathematica script reads the data in the Citifile format from the simulations and directly extracts the S and T coefficients at each power level for each fundamental frequency. Finally, the values of S and T at each power and frequency, for all combinations of indices, are written to another Citifile, which is read and interpolated by the simulator using a Frequency-Defined Device (FDD) implementation of the model in ADS using Equation 1, listed above.

Alternatively, setting $\epsilon=0$ gives the same information as Table 3, but the order of the rows may not be the same. By specifying the N (Mix1) or M (Mix2) values, the upper and lower sidebands can be selected as described above.

In the model of operation of DUT 15 represented by Equation 1, DUT 15, for example, represents an amplifier and is stimulated by a single large amplitude signal tone and multiple small amplitude signal tones to obtain S and T coefficients. When DUT 15 represents a mixer, the model can be modified, for example, to include a sum (or integral) of terms corresponding to frequencies offset an arbitrary amount from the fundamental frequency of a single large amplitude signal tone. This differs from the amplifier case where the terms of the model are indexed by the harmonics of the fundamental frequency of the large amplitude signal tone. To obtain S and T coefficients, small amplitude signal tones are injected at a plurality of frequencies offset from a large amplitude signal tone, and the resultant upper and lower sidebands are recorded at each offset frequency.

While a single large amplitude signal sinusoidal tone is typically used, in alternative embodiments of the present invention, the single large amplitude signal sinusoidal tone can be replaced with a large amplitude signal that may or may not be periodic. For example, the large amplitude signal can be a digital signal. In this case, the generalized linear response of a nonlinear dynamical system to small perturbations is calculated similar to as described above. For example, small amplitude signal tones are used to perturb the large amplitude signal. At each harmonic of at least one central frequency of the large amplitude signal, an upper and lower part is calculated; however, each upper and lower part may comprise a spectrum rather than a single sideband. The upper and lower spectral output response, for each suitably defined frequency of the small amplitude signal tone, can be used in substantially the same way as described above to extract a behavioral model giving the dynamical response of a digital system to small impairments. For example, this approach is extremely useful in efficiently solving the problem of predicting bit error rate (BER) in a digital system. A central frequency of the large amplitude signal is a middle frequency of a frequency band of the large amplitude signal that is of interest. For example, a large amplitude signal may have only one central frequency, or many have multiple central frequencies. For example, for a modulated signal, the carrier signal occurs at the center frequency of an input spectrum. The center frequency of the input spectrum is thus a central frequency of the modulated signal. For a tone signal, the central frequency occurs at the frequency of the tone.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for generating a model of a device comprising the following:
   stimulating an input port of the device with a large amplitude signal having a central frequency;
   perturbing a first port of the device with a small amplitude signal tone, wherein the small amplitude signal tone is at a frequency offset slightly from a harmonic of the central frequency; and,
   measuring spectral components of a resulting signal from the device to determine model coefficients for the device, at least some of the spectral components occurring at frequencies offset slightly from a plurality of harmonics of the central frequency.

2. A method as in claim 1 wherein the large amplitude signal has additional central frequencies, and wherein the method additionally comprises the following:
   perturbing the first port of the device with additional small amplitude signal tones, wherein the additional small amplitude signal tones are at frequencies offset slightly from harmonics of the additional central frequencies; and,
   obtaining additional spectral component frequencies based on spectral components resulting from perturbing the first port of the device with additional small amplitude signal tones.

3. A method as in claim 1 wherein the large amplitude signal is a tone and the central frequency is the frequency of the tone.

4. A method as in claim 1 wherein the large amplitude signal is a modulated signal and the central frequency is a carrier wave frequency of the modulated signal.

5. A method as in claim 1 wherein the device is a device under test and the obtaining is performed by a vector nonlinear network analyzer.

6. A method as in claim 1 wherein the device is a simulated device and the obtaining is performed by simulation software.

7. A method as in claim 1 wherein the device is a simulated device, wherein the obtaining is performed by simulation software and wherein the simulation software uses small-signal mixer analysis to stimulate and perturb the device so that harmonic balance analysis is done only for the large amplitude signal.

8. A method as in claim 1:
   wherein the perturbing is repeated for a plurality of harmonics of the central frequency and for additional ports of the device.

9. A method for generating a model of a device comprising the following:
   stimulating an input port of the device with a large amplitude signal having a central frequency;
   perturbing a first port of the device with a small amplitude signal tone, wherein the small amplitude signal tone is at a frequency offset slightly from a harmonic of the central frequency;
   obtaining spectral component frequencies of a resulting signal from the device to determine model coefficients for the device, at least some of the spectral component frequencies occurring at frequencies offset slightly from harmonics of the central frequency; and
   wherein a linearized response ($\Delta b_{lm}$) at a spectral component frequency at an $l^{th}$ harmonic of the central frequency, in response to the small amplitude signal tone being offset from a frequency that is at an $m^{th}$ harmonic of the central frequency is interpreted to be as set out in the equation below:

$$\Delta b_{lm} = S_{lm}\partial + T_{lm}\partial^*$$

where $\partial$ is a complex number, $S_{lm}$ is a coefficient determining amplitude signal at an upper sideband and $T_{lm}$ is a coefficient determining amplitude signal at a lower sideband.

10. A system that models a device, the system comprising:
    means for stimulating an input port of the device with a large amplitude signal having a central frequency;
    means for perturbing a first port of the device with a small amplitude signal tone, wherein the small amplitude signal tone is at a frequency offset slightly from a harmonic of the central frequency; and,
    means for measuring spectral components of a resulting signal from the device to determine model coefficients for the device, at least some of the spectral components occurring at frequencies offset slightly from a plurality of harmonics of the central frequency.

11. A system as in claim 10:
    wherein the means for stimulating an input port of the device is a large amplitude signal source;
    wherein the means for perturbing a first port of the device is a small signal source; and,
    wherein the means for obtaining spectral component frequencies of a resulting signal from the device is a vector nonlinear network analyzer.

12. A system as in claim 10 wherein the means for stimulating an input port of the device, the means for perturbing a first port of the device and the means for obtaining spectral component frequencies are implemented within simulation software.

13. A system as in claim 10 wherein the device is a simulated device, wherein the means for obtaining is implemented by simulation software and wherein the simulation software uses small-signal mixer analysis to stimulate and perturb the device so that harmonic balance analysis is done only for the large amplitude signal.

14. A system that models a device, the system comprising:
- means for stimulating an input port of the device with a large amplitude signal having a central frequency;
- means for perturbing a first port of the device with a small amplitude signal tone, wherein the small amplitude signal tone is at a frequency offset slightly from a harmonic of the central frequency;
- means for obtaining spectral component frequencies of a resulting signal from the device to determine model coefficients for the device, at least some of the spectral component frequencies occurring at frequencies offset slightly from harmonics of the central frequency; and,
- wherein a linearized response ($\Delta b_{lm}$) at a spectral component frequency at an $l^{th}$ harmonic of the central frequency, in response to the small amplitude signal tone being offset from a frequency that is at an $m^{th}$ harmonic of the central frequency is interpreted to be as set out in the equation below:

$$\Delta b_{lm} = S_{lm}\partial + T_{lm}\partial^*$$

where $\partial$ is a complex number, $S_{lm}$ is a coefficient determining amplitude signal at an upper sideband and $T_{lm}$ is a coefficient determining amplitude signal at a lower sideband.

15. Computer readable media containing software which when executed performs a method for generating a model of a device, the method comprising the following:
- stimulating an input port of the device with a large amplitude signal having a central frequency;
- perturbing a first port of the device with a small amplitude signal tone, wherein the small amplitude signal tone is at a frequency offset slightly from a harmonic of the central frequency; and
- measuring spectral components of a resulting signal from the device to determine model coefficients for the device, at least some of the spectral components occurring at frequencies offset slightly from a plurality of harmonics of the central frequency.

16. Computer readable media as in claim 15 wherein the device is a simulated device and the obtaining is performed by simulation software.

17. Computer readable media as in claim 15 wherein the device is a simulated device, wherein the obtaining is performed by simulation software and wherein the simulation software uses small-signal mixer analysis to stimulate and perturb the device so that harmonic balance analysis is done only for the large amplitude signal.

18. Computer readable media as in claim 15:
- wherein the perturbing is repeated for a plurality of harmonics of the central frequency and for additional ports of the device.

19. Computer readable media containing software which when executed performs a method for generating a model of a device, the method comprising the following:
- stimulating an input port of the device with a large amplitude signal having a central frequency;
- perturbing a first port of the device with a small amplitude signal tone, wherein the small amplitude signal tone is at a frequency offset slightly from a harmonic of the central frequency;
- obtaining spectral component frequencies of a resulting signal from the device to determine model coefficients for the device, at least some of the spectral component frequencies occurring at frequencies offset slightly from harmonics of the central frequency;
- wherein a linearized response ($\Delta b_{lm}$) at a spectral component frequency at an $l^{th}$ harmonic of the central frequency, in response to the small amplitude signal tone being offset from a frequency that is at an $m^{th}$ harmonic of the central frequency is interpreted to be as set out in the equation below:

$$\Delta b_{lm} = S_{lm}\partial + T_{lm}\partial^*$$

where $\partial$ is a complex number, $S_{lm}$ is a coefficient determining amplitude signal at an upper sideband and $T_{lm}$ is a coefficient determining amplitude signal at a lower sideband.

* * * * *